United States Patent
Peng et al.

(10) Patent No.: US 9,261,632 B2
(45) Date of Patent: Feb. 16, 2016

(54) LIGHT EMITTING DIODE DEVICE

(75) Inventors: Zhen Peng, Foster City, CA (US); Nathaniel Quitoriano, Pacifica, CA (US); Marco Fiorentino, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 1383 days.

(21) Appl. No.: 12/652,278

(22) Filed: Jan. 5, 2010

(65) Prior Publication Data

US 2011/0163336 A1 Jul. 7, 2011

(51) Int. Cl.
*G02B 5/18* (2006.01)
*G02B 19/00* (2006.01)

(52) U.S. Cl.
CPC ............ *G02B 5/1861* (2013.01); *G02B 5/1871* (2013.01); *G02B 19/0028* (2013.01); *G02B 19/0061* (2013.01)

(58) Field of Classification Search
USPC ............. 257/98, E33.067–E33.069, E33.055, 257/E33.056, E33.058, E33.059
See application file for complete search history.

(56) References Cited

U.S. PATENT DOCUMENTS

| | | | |
|---|---|---|---|
| 5,358,880 A | 10/1994 | Lebby et al. | |
| 6,172,811 B1 * | 1/2001 | Wood et al. | 359/573 |
| 6,674,096 B2 | 1/2004 | Sommers | |
| 7,360,936 B2 | 4/2008 | Abu-Ageel | |
| 7,370,994 B2 | 5/2008 | Li | |
| 2005/0263874 A1 * | 12/2005 | Shimizu et al. | 257/700 |
| 2008/0149959 A1 * | 6/2008 | Nakamura et al. | 257/98 |

* cited by examiner

*Primary Examiner* — Laura Menz
*Assistant Examiner* — Candice Y Chan
(74) *Attorney, Agent, or Firm* — Thorpe North & Western (57) ABSTRACT

A light emitting diode device is described which includes at least one planar non-periodic high-index-contrast grating. The light emitting diode device includes a cavity formed between a reflective optical element and a transmissive optical element. One or both of the optical elements can be a planar non-periodic high-index-contrast grating. The transmissive optical element can be a collimating lens used to collimate incident beams of light while the reflective optical element can be a parabolic reflector used to reflect incident beams of light along a direction opposite to an incidence direction. A light emitter can be disposed within the cavity and can emit beams of light.

13 Claims, 7 Drawing Sheets

LIGHT EMITTING DIODE DEVICE

BACKGROUND

A light emitting diode (LED) often can provide light more efficiently than other types of light sources, such as incandescent or fluorescent light bulbs. The relatively high power efficiency associated with LEDs has created an interest in using LEDs to displace conventional light sources in a variety of lighting applications. For example, LEDs can be used in traffic lights, cell phone keypad and display illumination, etc.

An LED is a semiconductor device that emits light when electrically biased in a forward direction. The light emission is a form of electroluminescence. An LED may generally include a chip of semiconducting material doped with impurities to create a pn junction. When forward biased, electrons are injected into the junction from the n-region and holes are injected from the p-region. The electrons and holes release energy in the form of photons as they combine. The emitted photons can be visible as light to an observer. The wavelength of the light can depend on the bandgap energy of the materials forming the pn junction.

Recently various advances have been made in terms of semiconductor materials used in LEDS. The materials can provide increased efficiency and operation across a wide variety of wavelengths. However, despite advances in materials used, much of the light emitted from the semiconductor material is lost due to internal reflections and absorption of the emitted light within the LED device. Many semiconductor materials have a high index of refraction as compared with the index of refraction of air at a semiconductor-air interface, leading to significant internal reflection. A high efficiency LED can be one in which a particular geometry is chosen which allows a greater emission of light from the device.

Previous solutions have used surface texturing to increase light output. Surface texturing uses a chemical etching process to provide texture to the surface of an LED device. However, controlling the shape and feature sizes of the texture can be difficult. In some devices a Distributed Bragg Reflector (DBR) has been added to the LED to reduce light absorption in the semiconductor substrate. However, DBRs are only able to reduce light absorption over a limited light incidence angle. In other devices, a photonic crystal has been added to the emitting surface of the LED to diffract waveguided modes out of the device. However, the fabrication of the photonic crystal on the emitting surface can be complicated and the end result provides increased efficiency over only a limited light bandwidth and the diffracted light is not quite collimated. A red LED with Lambertian transmittance and reflectance surfaces has been developed, but this LED uses multilayer structures with an undulating surface and a graded refractive index. These features increase fabrication complexity and cost and still cannot prevent light at oblique incident angles from being lost.

DETAILED DESCRIPTION

Reference will now be made to the exemplary embodiments illustrated, and specific language will be used herein to describe the same. It will nevertheless be understood that no limitation of the scope of the invention is thereby intended. Additional features and advantages of the disclosure will be apparent from the detailed description which follows, taken in conjunction with the accompanying drawings, which together illustrate, by way of example, features of the invention.

In describing and claiming the present invention, the following terminology will be used in accordance with the definitions set forth below.

As used herein, "light" is to be broadly interpreted to include any applicable spectral range including but not limited to visible, ultraviolet, and infra-red radiation.

As used herein, "high index contrast" is used to refer to ratio of the difference between the highest and the lowest refractive index in a device which is approximately 50% or more. This ratio is a measure for the field reflectivity of the high contrast interface under normal illumination. More precisely, the value of this ratio should be of the order of 50% or more.

As used herein, the term "grating" refers to any spaced collection of essentially identical, parallel, elongated elements. The elements may be made from any suitable material, including those described herein. A non-periodic grating refers to elements which are not all spaced at regular or uniform intervals.

As used herein, a "planar non-periodic high index contrast grating" refers to an optical device which is capable of transmitting or reflecting light and which is substantially flat and thin. In some embodiments, the planar non-periodic high index contrast grating may be made from one or more layers of thin film materials.

As used herein, "adjacent" refers to near or close sufficient to achieve a desired affect. Although direct physical contact is most common in the structures or volumes of the present disclosure, adjacent can broadly allow for spaced apart features.

As used herein, the term "substantially" refers to the complete or nearly complete extent or degree of an action, characteristic, property, state, structure, item, or result. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect on the property of interest thereof.

As used herein, the term "about" is used to provide flexibility to a numerical range endpoint by providing that a given value may be "a little above" or "a little below" the endpoint with a degree of flexibility as would be generally recognized by those skilled in the art. Further, the term about explicitly includes the exact endpoint, unless specifically stated otherwise.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually. This same principle applies to ranges reciting only one numerical value as a minimum or a maximum. Furthermore, such an interpretation can apply regardless of the breadth of the range or the characteristics being described.

Semiconductor LEDs are currently limited by poor light-extraction efficiency because light generated inside the semiconductor typically bounces around due to total internal reflection at the semiconductor-air interface. The semiconductor-air interface typically has a high contrast of refractive index, and light trapped in the LED cavity can be absorbed by the semiconductor material. Since LED efficiency can be defined by a comparison of light which exits the LED device (e.g., is not absorbed) to light which is emitted from the semiconductor, more light being absorbed by the semiconductor material results in a degraded efficiency.

In some LEDs, a reflective mirror has been used to reflect light towards a desired light emission portion of the LED. In other LEDs, diffraction gratings are used to provide light intensity maxima at a desired location. However, despite improvements in semiconductor materials and the addition of mirrors, gratings, etc., such LEDs have had shortcomings in a number of areas. For example, efforts to reduce the size of LEDs involving mirrors and optics have had limited success because of the difficulty in fabricating very small lenses with large curvatures and because of the precise polishing needed to make the lenses aberration free.

Accordingly, a light emitting diode device is described herein which includes at least one planar non-periodic high-index-contrast grating. An LED with such a grating can be easy and inexpensive to manufacture and provide high efficiency extraction of light even over a broadband spectrum. Furthermore, the grating of the LED can be a planar, highly integrable, single layer grating which can provide the advantages of other optic systems in a more inexpensive, planar package.

Figure 1A:
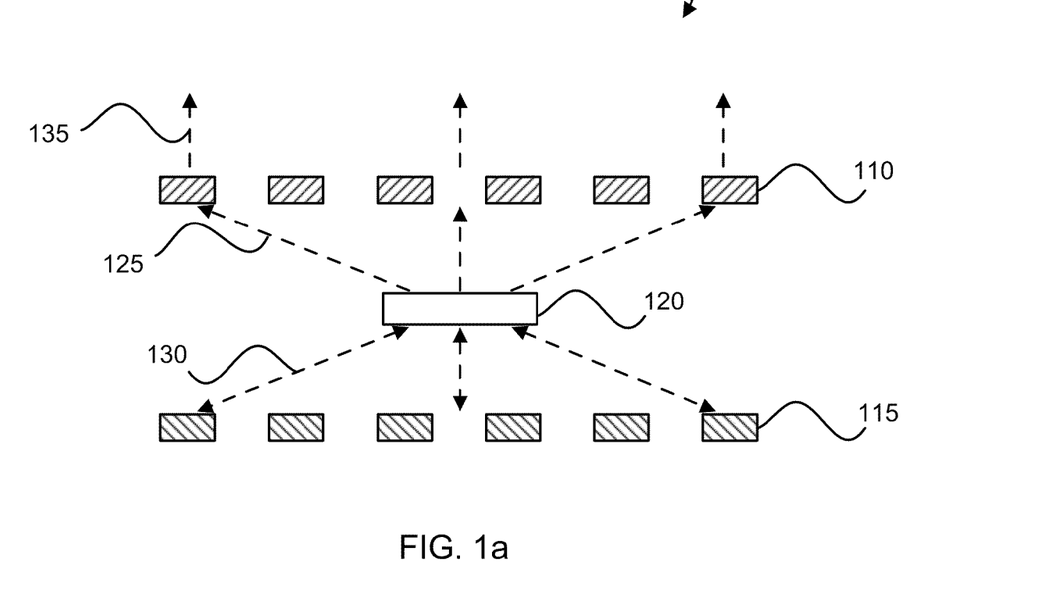
FIGS. 1a-1b show block diagrams of light emitting diode devices in accordance with embodiments of the present disclosure
Figure 1B:
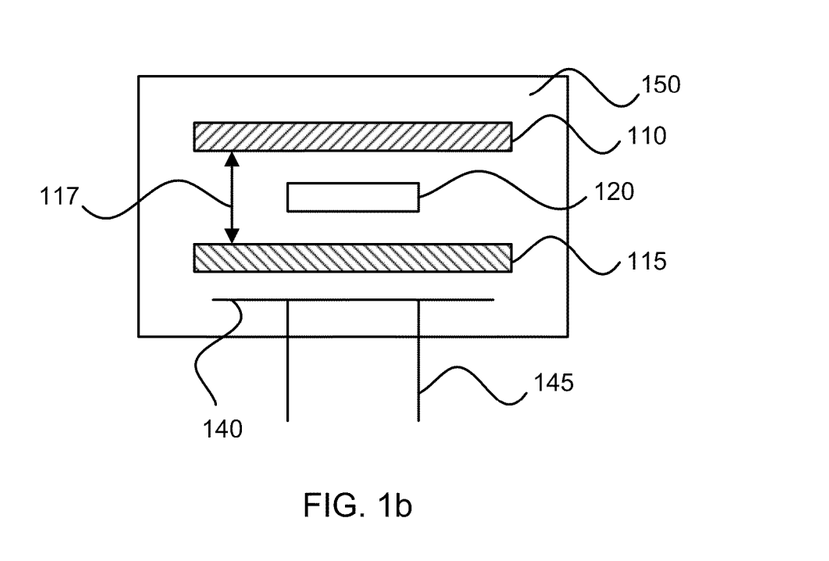

Referring to FIGS. 1a-1b, the light emitting diode device 100 or package can include a cavity 117 formed between a parabolic reflector 115 and a collimating lens 110. One or both of the parabolic reflector and collimating lens can be a planar non-periodic high-index-contrast grating. The collimating lens can be used to collimate incident beams of light 125 while the parabolic reflector can reflect incident beams of light 130 along a direction opposite to an incidence direction. A light emitter 120 can be disposed within the cavity and can emit beams of light.

The LED package can include an LED die and a lead frame 140 which includes a plurality of electrical leads 145. Generally the frame may include two leads. Terminals of the LED can be electrically connected to the electrical leads of the lead frame using conventional means, such as by wire bonds, etc. The LED package can include an encapsulant 150. The encapsulant can encapsulate at least the LED die, but can also encapsulate the frame, a portion of the electrical leads, the parabolic reflector, and the collimating lens. Greater LED efficiency can be obtained when the encapsulant is a transparent encapsulant. The encapsulant may comprise any desirable shape, size, color, etc. The encapsulant can prevent corrosion or degradation of the die or other portions of the LED package encapsulated by the encapsulant and can allow a certain degree of heat transfer to prevent overheating of the LED during operation.

The LED device can receive power from an external electrical source through the electrical leads, which can cause the semiconductor LED die to emit light or beams of light. The phrase "beams of light" is used for convenience and generally refers to light. "Beams of light" can be all or a portion of light emitted from an emitter and in certain aspects may pertain to light emitted in a particular direction from the emitter.

Regarding methods that can be used to generate the light emitting diodes shown in FIGS. 1a-1b, or other similar light emitting diodes, steps can include disposing a semiconductor having a pn junction between a parabolic reflective optical element and a transmissive collimating optical element, and encapsulating the transmissive collimating optical element, the parabolic reflective optical element, and the semiconductor with an encapsulant. The semiconductor can be configured to emit light in response to electrical stimulation, and can be electrically coupled to electrical leads, for example. In this embodiment, a least one of the parabolic reflective optical element and the transmissive collimating optical element can comprise a planar non-periodic high-index-contrast grating.

In a more specific embodiment with respect to the method, a frame can be provided which includes electrical leads for the light emitting diode device. A parabolic reflector can be positioned on the frame. A light emitter, such as a semiconductor having a pn junction, can be disposed over the parabolic reflector. The emitter can be disposed above the parabolic reflector such that an area is formed between the emitter and the parabolic reflector. The emitter can be configured to emit light in response to electrical stimulation. A collimating lens can be positioned over the semiconductor. The collimating lens can be disposed above the emitter such that an area is formed between the collimating lens and the emitter. The areas between the emitter and the parabolic reflector and the collimating lens and the emitter can be areas in which light beams can travel, be reflected, etc. The areas together may comprise a cavity in which the emitter is disposed. The layers of the elements in the device can be integrated or formed without space therebetween. For example, the emitter can completely or nearly completely fill the cavity. In an example device, the device may comprise a substrate upon which the parabolic reflector is disposed or formed. N-cladding of the pn junction can be formed over the parabolic reflector. A multiple quantum well (MQW) can be formed over the N-cladding. P-cladding of the pn junction can be formed over the MQW. A collimating transmissive optical element can then be formed or disposed over the P-cladding.

The frame, the collimating lens, the parabolic reflector, and the semiconductor can be encapsulated with an encapsulant. In one aspect, the encapsulant may comprise the frame. At least one of the parabolic reflector and the collimating lens may comprise a planar non-periodic high-index-contrast grating and may be formed as will be described in further detail below.

Various other LED packages and methods of LED package manufacture exist and are known in the art. Indeed the planar non-periodic high-index-contrast gratings described herein may be used in a wide variety of LED applications, and more particularly in LED devices involving transmissive or reflective optical devices.

In operation, the emitter is stimulated to emit light, such as broadband beams of light. Some of the light will be directed towards the collimating lens where the light can be collimated and extracted. Some of the light may be directed towards the parabolic reflector. The light directed toward the parabolic reflector will be redirected back along the path from which the light came and towards the collimating lens. Light reflected from the parabolic reflector can then be collimated and extracted. Use of the reflector enables extraction of light that otherwise may be lost due to absorption within the device. Use of the collimator can provide an easier accommodation of light collecting since all of the output light is collimated to travel in a substantially similar direction. Use of the gratings described herein for the collimator and/or the reflector can be an easy and inexpensive way to manufacture and provide high efficiency extraction LEDs. Furthermore, the grating of the LED can be a planar, highly integrable, single layer grating which can provide the advantages of other optic systems in a more inexpensive, planar package.

The planar non-periodic high-index-contrast gratings described herein are also more fully described and shown in co-pending U.S. Patent Application Serial No. PCT/US2009/051026 entitled NON-PERIODIC GRATING REFLECTORS WITH FOCUSING POWER AND METHODS FOR FABRICATING THE SAME filed on Jul. 17, 2009 and U.S. Patent Application Serial No. PCT/US2009/058006 entitled OPTICAL DEVICES BASED ON DIFFRACTION GRATINGS filed on Sep. 23, 2009, both of which are incorporated by reference in their entirety herein.

Non-periodic grating reflectors for use as the above-mentioned parabolic reflector will now be described. Embodiments of the present disclosure are directed to planar sub-wavelength dielectric gratings ("SWGs") that can be configured to operate as mirrors and other reflective optical devices in LED devices. The SWGs can be composed of two layers. The grating layer can be disposed on the surface of a substrate with the grating layer composed of a relatively higher refractive index material than the substrate or the grating layer can simply be fabricated in a suspended membrane without a substrate. SWGs configured in accordance with embodiments of the present disclosure provide new functionalities including phase front control. This can be accomplished by configuring the grating layer with a grating pattern to control phase changes in the light reflected from the SWG without substantially affecting the high reflectivity of the SWG. In certain embodiments, the grating layer can be configured so that the SWG can be operated as any type of optical device with an arbitrary reflecting surface. In particular, the grating layer of a SWG can be configured with a grating pattern enabling the SWG to be operated as a parabolic mirror. Embodiments of the present disclosure can also include methods and design rules for patterning the grating layer to generate a particular phase change across the mirror for the reflected beam using conventional lithography and etching techniques.

Figure 2:
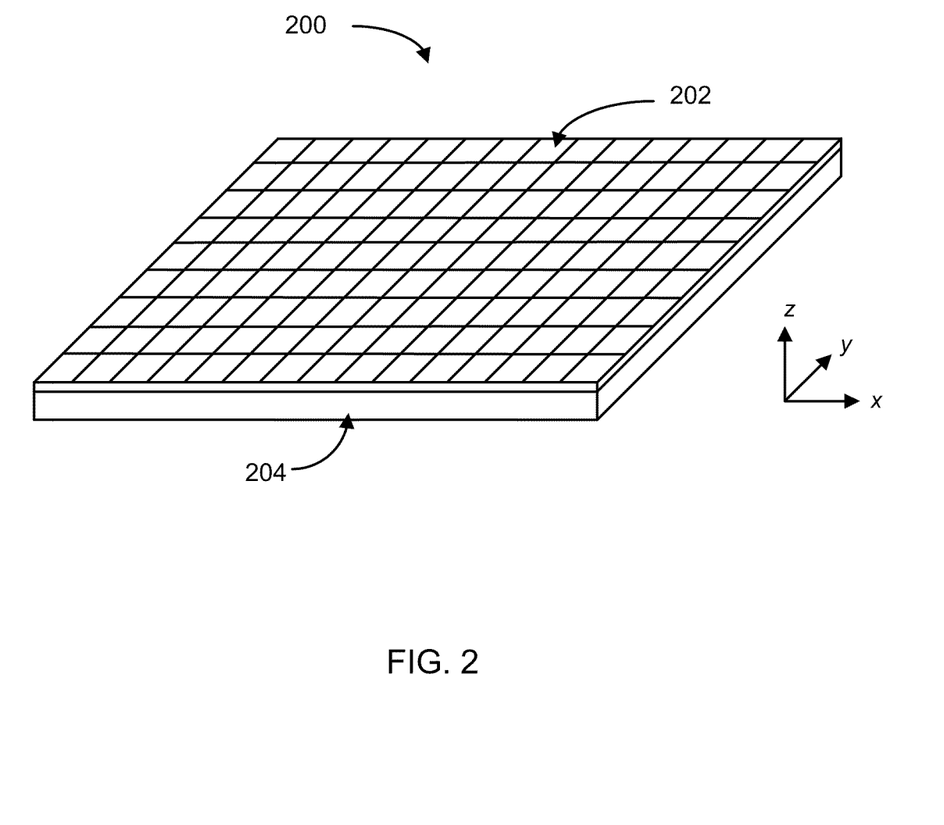
FIG. 2 shows an isometric view of a sub-wavelength grating configured in accordance with embodiments of the present disclosure.

FIG. 2 shows an isometric view of a SWG 200 configured in accordance with embodiments of the present disclosure. The SWG 200 includes a grating layer 202 disposed on a surface of a substrate 204, where the grating layer 202 is composed of a relatively higher refractive index material than the substrate 204. For example, the grating layer 202 can be composed of silicon ("Si") and the substrate 204 can be composed of quartz or silicon dioxide ("$SiO_2$"), or the grating layer 202 can be composed of gallium arsenide ("GaAs") and the substrate 204 can be composed of aluminum gallium arsenide ("AlGaAs") or aluminum oxide ("$Al_2O_3$"), or the grating layer 202 can be composed of gallium nitride ("GaN") and the substrate 204 can be composed of sapphire or $Al_2O_3$. As shown in the example of FIG. 2, the SWG 200 has a planar geometry, but the grating layer 202 can be configured with a particular grating pattern enabling the SWG 200 to be operated in the same manner as other optical devices, such as focusing and diverging cylindrical or parabolic mirrors. In other embodiments, the substrate can be eliminated by forming the grating layer 202 in a single membrane comprising Si, GaAs, GaN, indium phosphide ("InP"), or another suitable material. Particular reflectance properties of the SWG 200 can be determined by the grating pattern selected for the grating layer 202.

Figure 3:
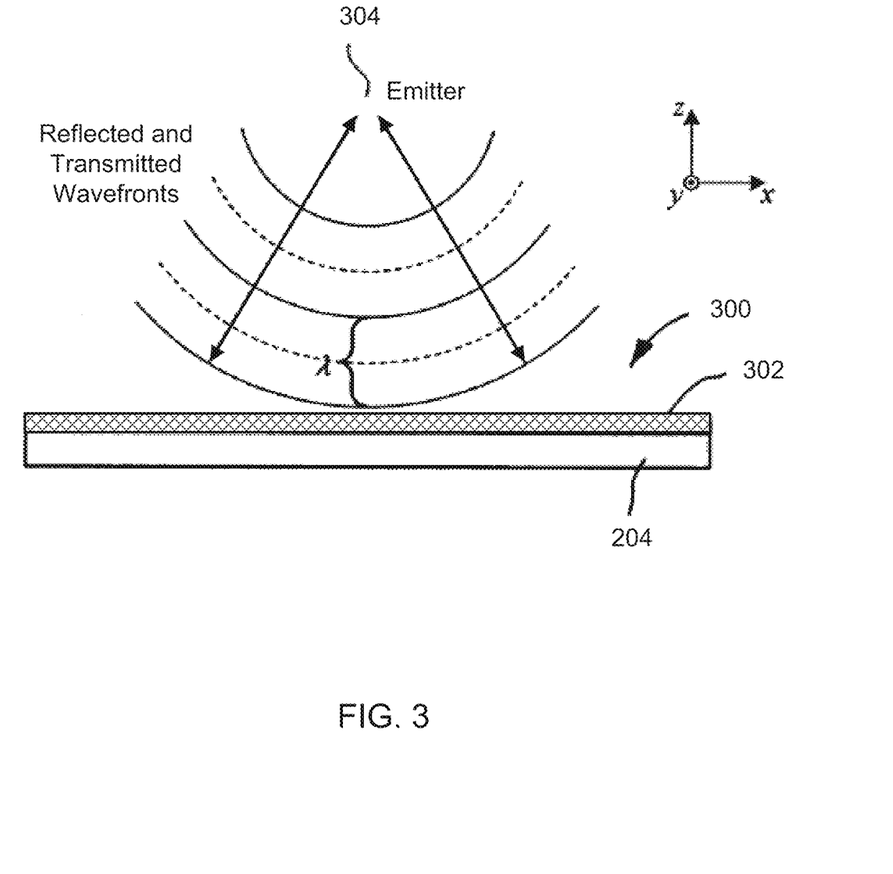
FIG. 3 shows a side view of a sub-wavelength grating configured to as a parabolic reflector in accordance with embodiments of the present disclosure.

FIG. 3 shows a side view of a SWG 300 with a grating layer 302 configured to focus incident light to a focal point 304 in accordance with embodiments of the present disclosure. In the example of FIG. 3, the grating layer 302 is configured with a grating pattern so that incident light is reflected with a wavefront corresponding to focusing the reflected light at the focal point 304. Embodiments directed to focusing and diverging light are described in greater detail below.

Figure 4:
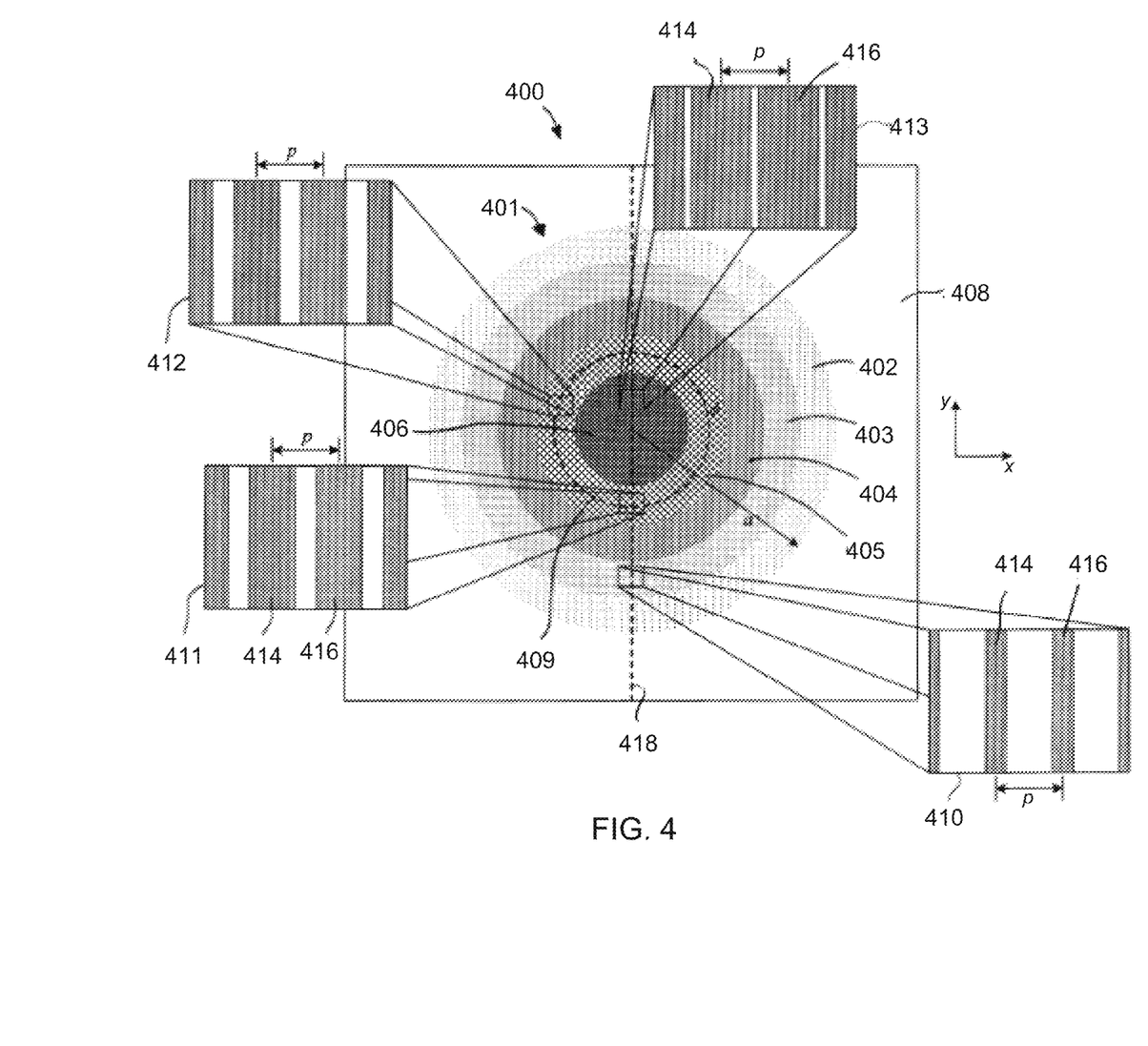
FIG. 4 shows a top plan view of a one-dimensional sub-wavelength grating configured to operate as a focusing parabolic mirror in accordance with embodiments of the present disclosure.

In certain embodiments, a SWG with a constant period can be configured to operate as a parabolic mirror for incident light polarized in a particular direction by tapering the lines of the grating layer away from the center of the SWG (i.e. by changing the duty cycle of the grating). FIG. 4 shows a top plan view of a one-dimensional SWG 400 configured to operate as a focusing parabolic mirror for incident light in accordance with embodiments of the present disclosure. The SWG 400 includes a grating layer 401 represented by annular shaded regions 402-406. The grating layer 401 can be composed of a material having a relatively higher refractive index than the substrate 408. The grating layer 401 defines a circular mirror aperture extending out from the origin with radius a. Each shaded annular region represents a different grating sub-pattern of lines formed in the grating layer 401. The grating sub-patterns of the annular regions 402-406 have the same duty cycle as revealed in the four enlargements 410-413. The enlargements 410-413 show that the grating pattern formed in the grating layer 401 comprises tapered lines running in the y-direction with a constant line period p in the x-direction. In particular, enlargements 410, 411, and 413 are enlargements of the same lines 414 and 416 running parallel to dashed-line 418 in the y-direction. Enlargements 410, 411, and 413 show that the period p remains constant but the width of the lines 414 and 416 narrows away from the center of the grating layer 401.

The grating can also be fabricated using photolithography, nano-imprint lithography, e-beam lithography with a positive tone resist, among other forms of etching and lithography techniques.

Non-periodic grating reflectors for use as a collimating lens will now be described. Embodiments of the present disclosure relate to transmissive and collimating planar optical devices composed of one or more sub-wavelength diffraction grating layers and for use in LED devices. The one or more grating layers can be configured with sub-wavelength grating patterns and inserted between reflective structures to produce optical devices that control the phase front of transmitted light. In particular, embodiments of the present disclosure include configuring the optical devices to operate as conventional transmissive optical elements, such as a convex lens, a concave lens, a prism, or a phase plate. Embodiments of the present disclosure can also include methods and design rules for patterning the one or more grating layers to generate a particular phase change in light transmitted through the optical device using conventional lithography and etching techniques.

Figure 5A:
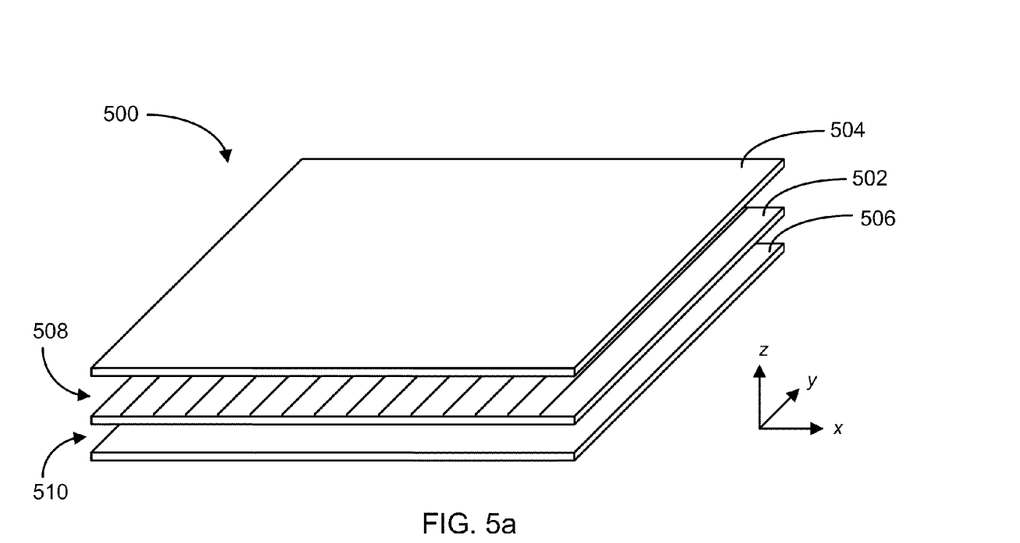
FIGS. 5a-5b show an isometric view, and an exploded isometric view, respectively, of an optical device configured in accordance with embodiments of the present disclosure.
Figure 5B:
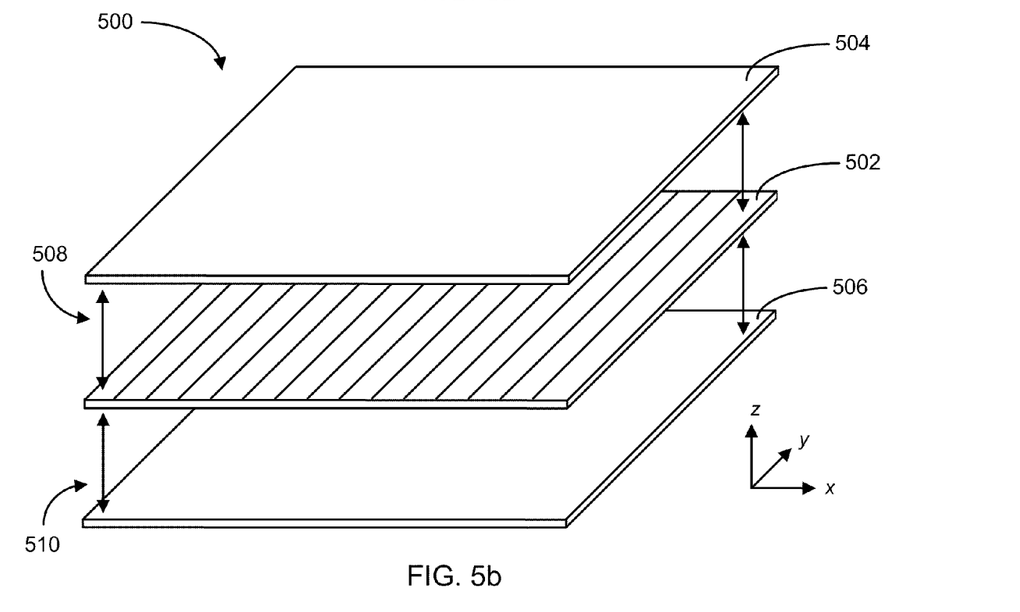

FIGS. 5a-5b show an isometric view, and an exploded isometric view, respectively, of an optical device 500 configured in accordance with embodiments of the present disclosure. The optical device 500 includes a substantially planar sub-wavelength grating ("SWG") layer 502 disposed between two approximately parallel, substantially planar, reflective structures 504 and 506. As shown in the example of FIG. 5, the substantially planar SWG layer 502 is positioned approximately parallel to the reflective structures 504 and 506 with spaces separating the SWG layer 502 from the reflective structures 504 and 506. The space between the SWG layer 502 and the reflective structure 504 forms a first resonant cavity 508, and the space between the SWG layer 502 and the reflective structure 506 forms a second resonant cavity 510, for appropriate wavelengths of electromagnetic radiation. The reflective structures 504 and 506 can be composed of a dielectric material; a semiconductor; a metal, such as gold or silver; or any other suitable material for forming resonant cavities 508 and 510. In certain embodiments, the cavities 508 and 510 can be filled with a material having a lower refractive index than the layers 502, 504, and 506, such as a suitable polymer material. In other embodiments, the cavities 508 and 510 can be air filled with the reflective structures 504 and 506 and the SGW layer 502 supported by at least one wall of a container (not shown).

The grating pattern can be composed of a number of one-dimensional grating sub-patterns. For example, each grating sub-pattern comprises a number of regularly spaced wire-like portions of the SWG layer 502 material called "lines." The lines can extend in the y-direction and are periodically spaced in the x-direction. In one aspect, the SWG layer 502 can be composed of lines disposed on a surface of a substrate, where the lines are composed of a relatively higher refractive index material than the substrate. As an example, the lines can be composed of silicon ("Si") and the substrate can be composed of quartz or silicon dioxide ("$SiO_2$"), or the lines can be composed of gallium arsenide ("GaAs") and the substrate can be composed of aluminum gallium arsenide ("AlGaAs") or aluminum oxide ("$Al_2O_3$"), or the lines can be composed of gallium nitride ("GaN") and the substrate can be composed of sapphire or $Al_2O_3$. In other embodiments, the SWG layer 502 can be a single membrane with lines separated by grooves formed in the membrane. The single membrane can be composed of any suitable material, such as Si, GaAs, GaN, or indium phosphide ("InP").

Note the SWG layer 502 can be configured to reflect the x-polarized component or the y-polarized component of the incident light by adjusting the period, line width and line thickness of the lines. For example, a particular period, line width and line thickness may be suitable for reflecting the x-polarized component of light but may not be suitable for reflecting the y-polarized component; and a different period, line width and line thickness may be suitable for reflecting the y-polarized component but may not be suitable for reflecting the x-polarized component.

Figure 6:
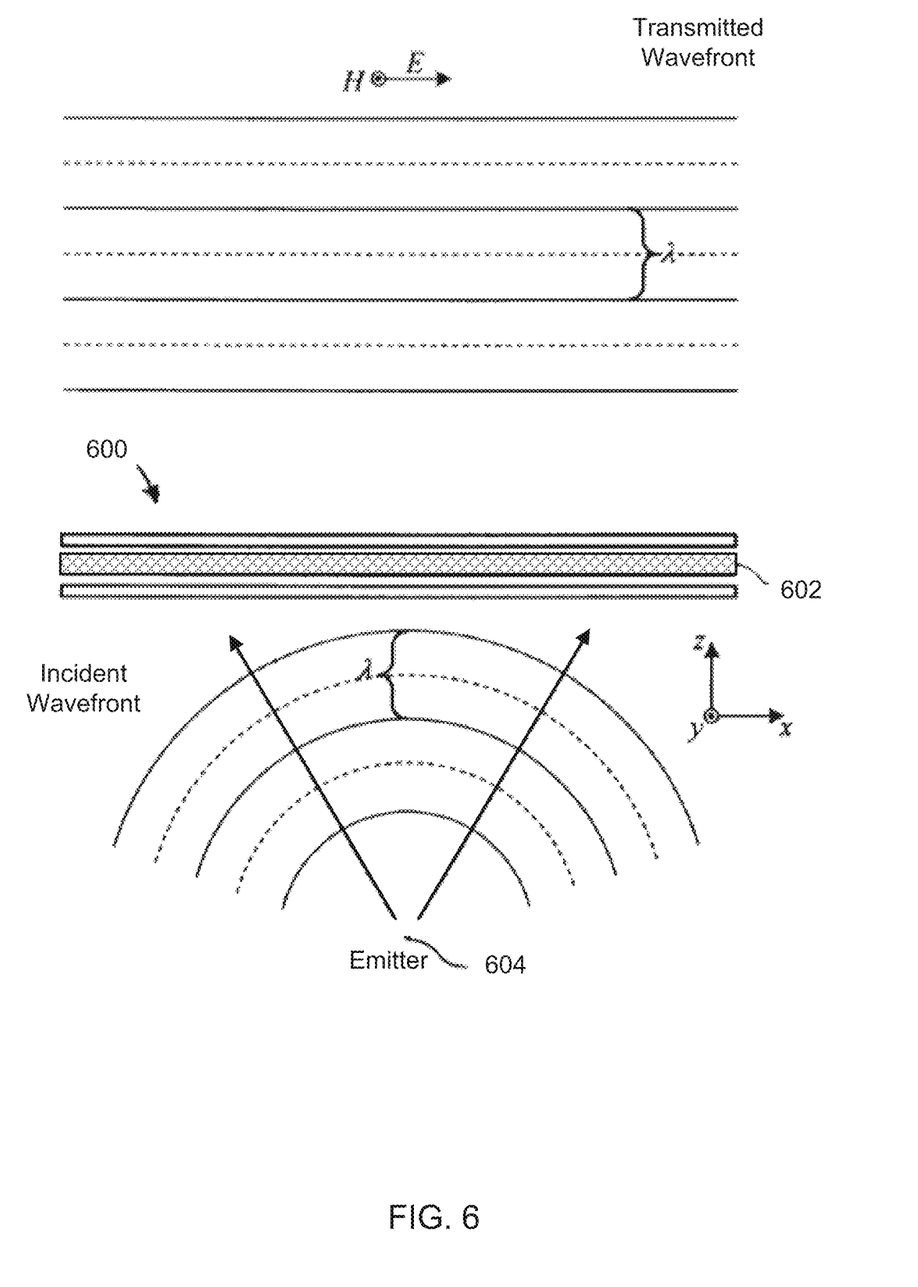
FIG. 6 shows a side view of a sub-wavelength grating configured and operated as a collimating lens in accordance with embodiments of the present disclosure.

FIG. 6 shows a cross-sectional view of an optical device 600 with a SWG layer 602 configured to collimate light emanating from an emitter at point 604 in accordance with embodiments of the present disclosure. In the example shown, the grating layer 602 is configured with a grating pattern so that incident light polarized in the x-direction is transmitted with a collimated wavefront.

Consider configuring a simple a SWG layer of the device configured to operate as a collimating lens for polarized light. Changes in the duty cycle are achieved by varying the line width of the SWG layer while holding the period constant throughout. The grating pattern of the SWG layer defines a lens aperture extending the length of the SWG in the y-direction and having a length in the x-direction. The pattern can include different regions representing different grating sub-patterns of lines extending the y-directions, with some regions having a relatively larger duty cycle than other regions. Grating lines can run parallel in the y-direction and the line period spacing p can be constant or fixed in the x-direction. The line width w, or in other words the duty cycle η, can also be decreased away from the center. The SWG layer can be configured so that light polarized in the x-direction and transmitted through an optical device is collimated.

In certain embodiments, the SWG layer of the device can be configured so that the optical device can be operated as a collimating lens for incident light polarized in any direction by appropriately tapering the lines of the SWG layer away from the center of the SWG layer. The pattern of tapered lines can be similar to the pattern described above in FIG. 4. In other words, the SWG layer can include a grating pattern which defines a circular aperture extending outward from the origin. The pattern can include different grating sub-patterns of lines formed in the grating layer. The differences in the layers of the collimating lens device and the parabolic mirror device as described above and also as described in the co-pending applications incorporated herein are some of the factors which determine whether the planar non-periodic high index contrast grating is operative as a reflective optical element or a transmissive optical element.

The optical devices can be fabricated using conventional deposition and lithographic techniques. For example, the optical devices described above can all be fabricated by depositing a first semiconductor or metal layer on a surface of a silicon dioxide ("$SiO_2$") substrate using chemical vapor deposition ("CVD") or physical vapor deposition (PVD). Next, a polymer resist can be deposited over the first layer using CVD followed by depositing a second semiconductor layer using CVD or PVD. Next, the second semiconductor layer is configured to operate as the SWG layer using reactive ion etching, focusing ion beam milling, nanoimprint lithography, e-beam lithography, photolithography, or any other suitable technique for forming grooves separating lines in the SWG layer. Next, a second polymer resist can be deposited over the second semiconductor layer using CVD followed by depositing a third semiconductor or metal layer using CVD or PVD. In certain embodiments, the polymer resist is composed of material having a lower refractive index than the first, second, and third semiconductor layers. In other embodiments, the polymer layer can be removed by depositing all five layers in an opening of a container, such as a hollow cylinder. Holes can be formed in the container walls to access the polymer layers. A solvent is introduced through the holes to dissolve the polymer layers leaving air spaces separating the three layers.

Figure 7:
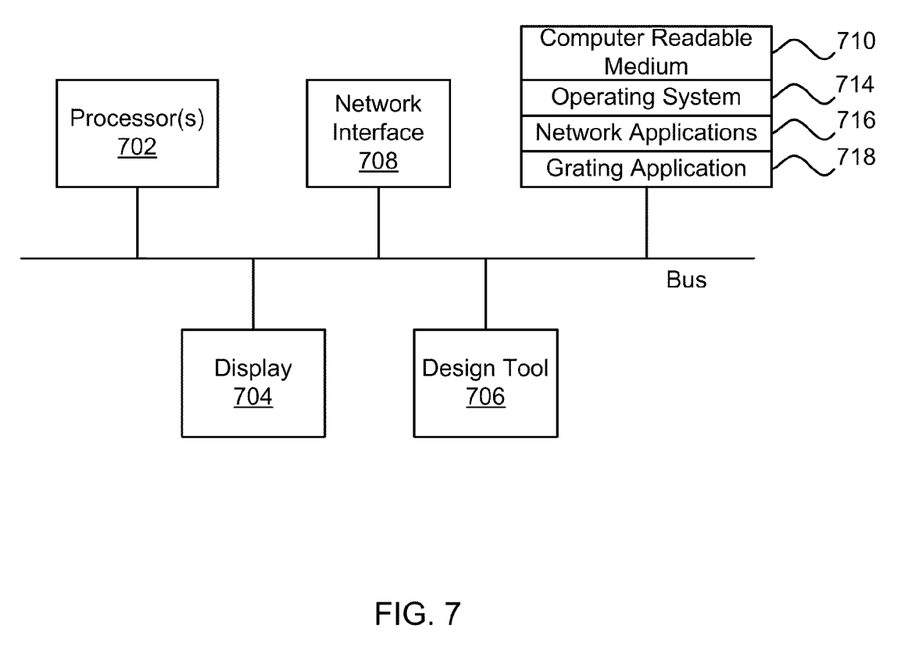
FIG. 7 shows a schematic representation of a computing device configured in accordance with embodiments of the present disclosure.

In general, the methods employed to generate gating pattern data for a SWG layer can be implemented on a computing device, such as a desktop computer or a laptop. FIG. 7 shows a schematic representation of a computing device 700 configured in accordance with embodiments of the present disclosure. The device 700 includes one or more processors 702, such as a central processing unit; one or more display devices 704, such as a monitor; a design tool interface 706; one or more network interfaces 708, such as a Local Area Network LAN, a wireless 802.11x LAN, a 3G mobile WAN or a WiMax WAN; and one or more computer-readable mediums 710. Each of these components is operatively coupled to one or more buses 712. For example, the bus 712 can be an EISA, a PCI, a USB, a FireWire, a NuBus, or a PDS.

The computer readable medium 710 can be any suitable medium that participates in providing instructions to the processor 702 for execution. For example, the computer readable medium 710 can be non-volatile media, such as an optical disk, a magnetic disk, or a magnetic disk drive; volatile media, such as memory; and transmission media, such as coaxial cables, copper wire, and fiber optics. The computer readable medium 710 can also store other software applications, including word processors, browsers, email, Instant Messaging, media players, and telephony software.

The computer-readable medium 710 may also store an operating system 714, such as Mac OS, MS Windows, Unix, or Linux; network applications 1516; and a grating application 718. The operating system 714 can be multi-user, multi-processing, multitasking, multithreading, real-time and the like. The operating system 714 can also perform basic tasks such as recognizing input from input devices, such as a keyboard or a keypad; sending output to the display 704 and the design tool 706; keeping track of files and directories on medium 710; controlling peripheral devices, such as disk drives, printers, image capture device; and managing traffic on the one or more buses 712. The network applications 716 includes various components for establishing and maintaining network connections, such as software for implementing communication protocols including TCP/IP, HTTP, Ethernet, USB, and FireWire.

The grating application 718 provides various software components for generating grating pattern data. In certain embodiments, some or all of the processes performed by the application 718 can be integrated into the operating system 714. In certain embodiments, the processes can be at least partially implemented in digital electronic circuitry, or in computer hardware, firmware, software, or in any combination thereof.

The systems and methods described herein enable a light emitting diode device which includes at least one planar non-periodic high-index-contrast grating. An LED with such a grating can be easy and inexpensive to manufacture and provide high efficiency extraction of light even over a broadband spectrum. Furthermore, the grating of the LED can be a planar, highly integrable, single layer grating which can provide the advantages of other optic systems in a more inexpensive, planar package. As such, the use of a planar non-periodic high-index-contrast grating can provide numerous advantages over prior devices.

Reference throughout this specification to "one embodiment", "an embodiment", or "a specific embodiment" means that a particular feature, structure, or characteristic described in connection with the embodiment is included in at least one embodiment of the present disclosure. Thus, the appearances of the phrases "in one embodiment", "in an embodiment", or "in a specific embodiment" in various places throughout this specification are not necessarily all referring to the same embodiment. Furthermore, the particular features, structures, or characteristics may be combined in any suitable manner in one or more embodiments.

Other variations and modifications of the above-described embodiments and methods are possible in light of the foregoing disclosure. Further, at least some of the components of an embodiment of the disclosure may be implemented by using a programmed general purpose digital computer, by using application specific integrated circuits, programmable logic devices, or field programmable gate arrays, or by using a network of interconnected components and circuits. Connections may be wired, wireless, and the like.

It will also be appreciated that one or more of the elements depicted in the drawings/figures can also be implemented in a more separated or integrated manner, or even removed or rendered as inoperable in certain cases, as is useful in accordance with a particular application.

Also within the scope of an embodiment is the implementation of a program or code that can be stored in a machine-readable medium to permit a computer to perform any of the methods described above.

Additionally, the signal arrows in the FIGS. are considered as exemplary and are not limiting, unless otherwise specifically noted. Furthermore, the term "or" as used in this disclosure is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Various functions, names, or other parameters shown in the drawings and discussed in the text have been given particular names for purposes of identification. However, the functions, names, or other parameters are only provided as some possible examples to identify the functions, variables, or other parameters. Other function names, parameter names, etc. may be used to identify the functions, or parameters shown in the drawings and discussed in the text.

While the forgoing examples are illustrative of the principles of the present disclosure in one or more particular applications, it will be apparent to those of ordinary skill in the art that numerous modifications in form, usage and details of implementation can be made without the exercise of inventive faculty, and without departing from the principles and concepts of the disclosure. Accordingly, it is not intended that the invention be limited, except as by the claims set forth below.

What is claimed is:
1. A light emitting diode device, comprising:
a transmissive optical element configured to collimate incident beams of light;

a reflective optical element configured to reflect incident beams of light along a direction opposite to an incidence direction;

a cavity between the transmissive optical element and the reflective optical element formed by the transmissive optical element and the reflective optical element; and a light emitter within the cavity and configured to emit beams of light, such that some of the light is to be directed toward the transmissive optical element and some of the light is to be directed towards the reflective optical element, which is then to be redirected back along a path from which the light came and towards the transmissive optical element;

wherein at least one of the transmissive optical element and the reflective optical element is a planar non-periodic high-index-contrast grating.

2. A device as in claim 1, wherein the beams of light emitted from the light emitter comprise a plurality of wavelengths.

3. A device as in claim 1, wherein the transmissive optical element is a collimating lens configured to transmit light from a plurality of incident angles in parallel.

4. A device as in claim 1, wherein the reflective optical element is a parabolic reflector configured to reflect incident beams of light from a plurality of different directions back along the plurality of directions of incidence.

5. A device in accordance with claim 1, wherein the light emitter comprises a transparent light emitter.

6. A light emitting diode device, comprising:
a first planar non-periodic high-index-contrast grating configured as a transmissive collimating optical element;
a second planar non-periodic high-index-contrast grating configured as a parabolic reflective optical element;
a cavity between the transmissive collimating optical element and the parabolic reflective optical element formed by the transmissive collimating optical element and the parabolic reflective optical element; and
a light emitter within the cavity and configured to emit light, such that some of the light is to be directed toward the transmissive collimating optical element and some of the light is to be directed towards the parabolic reflective optical element, which is then to be redirected back along a path from which the light came and towards the transmissive collimating optical element.

7. A device as in claim 6, wherein the parabolic reflective optical element comprises a reflective sub-wavelength grating comprising a grating layer, the grating layer having a planar geometry and configured with lines, the lines widths, line thicknesses and line period spacing selected to control phase changes in different portions of the emitted light which is reflected from the grating such that the phase changes collectively produce a desired wavefront shape in the emitted light reflected from the grating.

8. A device as in claim 7, wherein the lines width, line thickness and line period spacing are selected such that the reflective sub-wavelength grating forms a converging parabolic reflector.

9. A device as in claim 7, further comprising a substrate, wherein the grating layer is disposed on the substrate and the grating layer is composed of a material having a relatively higher refractive index than the refractive index of the substrate.

10. A device as in claim 6, wherein the transmissive collimating optical element further comprises:
a first substantially planar reflective structure;
a second substantially planar reflective structure; and
a substantially planar sub-wavelength grating layer disposed between the first reflective structure and the second reflective structure, wherein the grating layer is configured with lines having line widths, line thicknesses, and line period spacing selected to control phase changes in different portions of a beam of light transmitted through the transmissive collimating optical element.

11. A device as in claim 10, wherein at least one of the first reflective structure and the second reflective structure are configured as sub-wavelength grating layers configured with lines having line widths, line thicknesses, and line period spacing selected to control phase changes in different portions of a beam of light transmitted through the transmissive collimating optical element.

12. A device as in claim 11, wherein the lines widths, line thickness, and line period spacing of the sub-wavelength grating layer and the first or second substantially planar reflective surface are selected to form a transmissive collimating optical element.

13. A device as in claim 6, wherein the cavity comprises air.

* * * * *

UNITED STATES PATENT AND TRADEMARK OFFICE
CERTIFICATE OF CORRECTION

PATENT NO.      : 9,261,632 B2
APPLICATION NO. : 12/652278
DATED           : February 16, 2016
INVENTOR(S)     : Zhen Peng et al.

Page 1 of 1

It is certified that error appears in the above-identified patent and that said Letters Patent is hereby corrected as shown below:

In the Claims

In column 12, line 11, in Claim 08, delete "thickness and" and insert -- thickness, and --, therefor.

Signed and Sealed this
Fourteenth Day of June, 2016

Michelle K. Lee
*Director of the United States Patent and Trademark Office*